United States Patent [19]
Sameshima et al.

[11] Patent Number: 5,145,808
[45] Date of Patent: Sep. 8, 1992

[54] METHOD OF CRYSTALLIZING A SEMICONDUCTOR THIN FILM

[75] Inventors: Toshiyuki Sameshima; Masaki Hara, both of Kanagawa; Naoki Sano, Tokyo; Setsuo Usui, Kanagawa, all of Japan

[73] Assignee: Sony Corporation, Tokyo, Japan

[21] Appl. No.: 747,708

[22] Filed: Aug. 20, 1991

[30] Foreign Application Priority Data

Aug. 22, 1990 [JP] Japan .................................. 2-220604

[51] Int. Cl.$^5$ ...................... H01L 21/268; C30B 13/24
[52] U.S. Cl. ................................. 437/173; 156/620.72; 437/174; 148/DIG. 93; 148/DIG. 134
[58] Field of Search ............... 437/173, 174, 967, 973; 148/DIG. 1, DIG. 3, DIG. 93, DIG. 122, DIG. 134, DIG. 154; 156/620.72

[56] References Cited

U.S. PATENT DOCUMENTS

| | | | |
|---|---|---|---|
| 4,343,829 | 8/1982 | Tochikobo et al. | 437/173 |
| 4,372,989 | 2/1983 | Menzel | 148/DIG. 93 |
| 4,406,709 | 9/1983 | Celler et al. | 156/620.72 |
| 4,487,635 | 12/1984 | Kugimiya et al. | 437/173 |
| 4,707,217 | 11/1987 | Aklufi | 156/620.72 |
| 4,714,684 | 12/1987 | Sugahara et al. | 148/DIG. 93 |

FOREIGN PATENT DOCUMENTS

| | | | |
|---|---|---|---|
| 76715 | 3/1989 | Japan . | |
| 1-25817 | 5/1989 | Japan | 156/620.72 |
| 2-225397 | 9/1990 | Japan | 156/620.72 |

Primary Examiner—Brian E. Hearn
Assistant Examiner—Linda J. Fleck
Attorney, Agent, or Firm—Hill, Van Santen, Steadman & Simpson

[57] ABSTRACT

A method of crystallizing a semiconductor thin film moves a laser beam emitted by a pulse laser in a first direction to irradiate the semiconductor tin film with the laser beam for scanning. The laser beam is split into a plurality of secondary laser beams of a width smaller than the pitch of step feed, respectively having different energy densities forming a stepped energy density distribution decreasing from the middle toward the opposite ends thereof with respect to the direction of step feed. The energy density of the first secondary laser beam corresponding to the middle of the energy distribution is higher than a threshold energy density, i.e., the minimum energy density that will melt the semiconductor thin film to make the same amorphous, and lower than a roughening energy density, i.e., the minimum energy density that will roughen the surface of the semiconductor thin film, the energy density of each of the secondary laser beams on the front side of the first secondary laser beam with respect to the direction of step feed is lower than a melting energy density, i.e., the minimum energy density of each of the secondary laser beams on the back side of the first secondary laser beam with respect to the direction of step feed is higher than the melting energy density and lower than and nearly equal to the threshold energy density.

3 Claims, 5 Drawing Sheets

METHOD OF CRYSTALLIZING A SEMICONDUCTOR THIN FILM

BACKGROUND OF THE INVENTION

1. Field of the Invention

The present invention relates to a method of crystallizing a semiconductor thin film and, more particularly, to a method of crystallizing a semiconductor thin film, comprising melting the semiconductor thin film by irradiating the same with a laser beam emitted by a pulse laser.

2. Description of the Prior Art

A method of crystallizing a semiconductor thin film has been proposed which crystallizes a semiconductor thin film, such as an amorphous silicon hydride thin film (a-Si:H thin film) or an amorphous germanium hydride thin film (a-Ge:H thin film), for semiconductor integrated circuits by melting and solidifying the semiconductor thin film by irradiating the same with a laser beam emitted by a pulse laser. This known method has been a noticeable technique for fabricating thin film transistors with a high carrier mobility.

A method of forming a polycrystalline semiconductor thin film disclosed, for example, in Japanese Patent Laid-open No. Sho 64-76715 forms a polycrystalline semiconductor thin film by irradiating an amorphous silicon hydride semiconductor thin film formed on a glass substrate with a laser beam having a laterally trapezoidal intensity distribution. The use of such a laser beam avoids the deterioration in quality of the semiconductor thin film due to the rapid evaporation of hydrogen contained in the semiconductor thin film. However, this known method is not necessarily capable of forming a semiconductor thin film having satisfactorily electrical characteristics including high carrier mobility.

SUMMARY OF THE INVENTION

It is an object of the present invention to provide a method of crystallizing a semiconductor thin film, capable of forming a crystalline semiconductor thin film of high quality having excellent electrical characteristics including high carrier mobility.

A method of crystallizing a semiconductor thin film in accordance with the present invention capable of providing a crystalline semiconductor thin film has been invented on the basis of facts that a semiconductor thin film, whether it contains a volatile substance, such as hydrogen, or not, becomes an amorphous semiconductor thin film and it is impossible to obtain a crystalline semiconductor thin film having desired characteristics if the semiconductor thin film is melted and solidified by a melt growth crystallization process using a laser beam having an energy density exceeding a certain threshold energy density, even if the energy of the laser beam is increased gradually so that the volatile substance, such as hydrogen, contained in the semiconductor thin film may not evaporate rapidly, that it is desirable to use a laser beam having high energy density as far as the semiconductor thin film can be crystallized and that a semiconductor thin film of high quality having satisfactory electrical characteristics can be obtained even if the semiconductor thin film is melted by a laser beam having high energy density and solidified, when the semiconductor thin film once melted and solidified is melted again by using a laser beam having a threshold energy density, which is lower than and very close to a threshold energy density $E_{Dth}$ that makes the semiconductor thin film amorphous.

The present invention provides a method of a melt growth system of crystallizing a semiconductor thin film, in which a semiconductor thin film is irradiated with a laser beam emitted by a pulse laser in a zigzag scanning mode, in which the laser beam scans the semiconductor thin film in a first direction x for parallel scanning and in a second direction y perpendicular to the first direction x for step feed, or in a parallel scanning mode, in which the laser beam scans the semiconductor thin film in the first direction x. The laser beam emitted by the pulse laser is split into a plurality of secondary laser beams to form a spot consisting of a plurality of divisional spots of the secondary laser beams having a width smaller than the pitch of step feed so that the energy density distribution with respect to the second direction y in the spot decreases stepwise from the central divisional spot toward the opposite end divisional spots. The energy density $E_{D1}$ of the first secondary laser beam is higher than or equal to the threshold energy density $E_{Dth}$, which makes a semiconductor thin film amorphous, and lower than a roughening energy density $E_{DR}$, which roughens the semiconductor thin film. The energy density $E_{D2}$ of the second secondary laser beam forming the divisional spot in front of the divisional spot of the first secondary laser beam with respect to the step feed direction y is lower than a melting energy density $E_{DM}$, which melts the semiconductor thin film and higher than an energy density capable of heating the semiconductor thin film to a temperature at which the volatile substance contained in the semiconductor thin film evaporates more or less. The energy density $E_{D3}$ of the third secondary laser beam forming the divisional spot behind the divisional spot of the first secondary laser beam with respect to the step feed direction y is lower than the threshold energy density $E_{Dth}$ and not lower than and nearly equal to the melting energy density $E_{DM}$.

When the spot S of the laser beam is moved in the first direction x on the semiconductor thin film to scan an area of the semiconductor thin film along the first direction x, first the area is irradiated with the second secondary laser beam having the energy density $E_{D2}$ to evaporate the volatile substances contained in the semiconductor thin film at a moderate rate, subsequently, the same area is irradiated with the first secondary laser bean having the high energy density $E_{D1}$ to temporarily make the semiconductor thin film amorphous and, finally, the same area is irradiated with the third secondary laser beam having the energy density $E_{D3}$, which is comparatively high, though lower than the threshold energy density $E_{Dth}$, to crystallize the same are of the semiconductor thin film. This scanning procedure is repeated to obtain a crystalline semiconductor thin film having satisfactory electrical characteristics including high carrier mobility.

Thus, the method in accordance with the present invention using a laser beam having a stepped energy density distribution with respect to the second direction y, i.e., the step feed direction, and a stepped energy density distribution with respect to the first direction x, i.e., the scanning direction, is capable of surely forming a crystalline semiconductor thin film having excellent electrical characteristics and of avoiding the adverse influence of the fluctuation of the spot of the laser beam relative to the scanning line on crystallization.

Crystalline semiconductor thin films formed by the method in accordance with the present invention can effectively be used for forming semiconductor elements, such as thin film transistors, having excellent characteristics, and the method can effectively applied to fabricating semiconductor devices, such as integrated circuits.

BRIEF DESCRIPTION OF THE DRAWINGS

The above and other objects, features and advantages of the present invention will become more apparent from the following description taken in connection with the accompanying drawings, in which.

DETAILED DESCRIPTION OF THE PREFERRED EMBODIMENTS

The principle on which the present invention is based will be described prior to the description of the preferred embodiments thereof.

Figure 3:
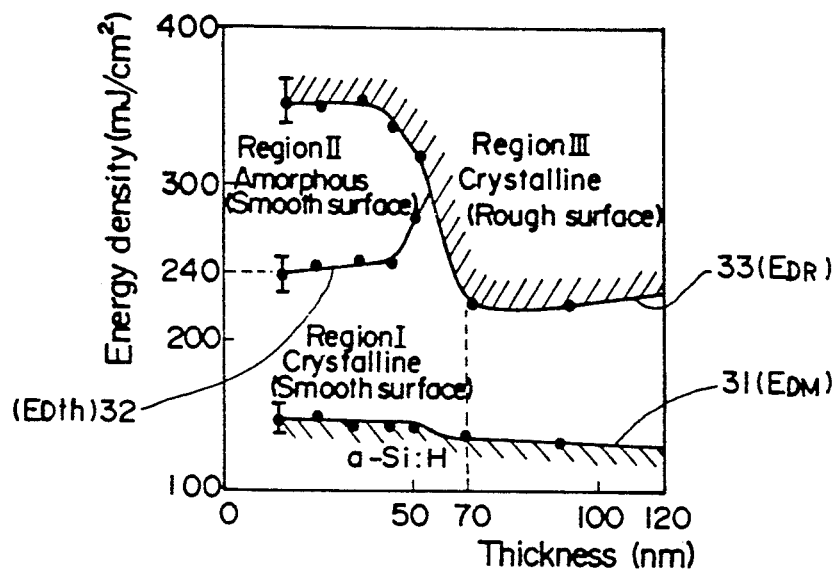
FIG. 3 is a phase diagram of a semiconductor thin film when subjected to irradiation with a laser beam.

Referring to FIG. 3, i.e., a phase diagram showing the dependence of the condition of an amorphous silicon hydride semiconductor thin film (a-Si:H semiconductor thin film) on the energy density of a laser beam emitted by a XeCl excimer laser to irradiate the a-Si:H thin film for the thickness of the a-Si:H semiconductor thin film, no phase change occurs in the a-Si:H semiconductor thin film when the same is irradiated by a laser beam having an energy density in the energy density range of 120 to 150 mJ/cm$^2$ below a curve 31 corresponding to the melting energy density $E_{DM}$. The a-Si:H thin film melts and solidifies in a crystalline silicon hydride semiconductor thin film of good quality having a smooth surface in a region I where the energy density of the laser beam is above the curve 31 corresponding to the melting energy density $E_{DM}$ and below a curve 32 corresponding to the threshold energy density $E_{Dth}$ and below a curve 33 corresponding to the roughening energy density $E_{DR}$. A crystalline semiconductor thin film of good quality can be formed by irradiating an a-Si:H semiconductor thin film with a laser beam having an energy density exceeding 240 mJ/cm$^2$ when the thickness of the a-Si:H semiconductor thin film is less than about 70 nm or with a laser beam having a high energy density on the order of 300 mJ/cm$^2$ when the a-Si:H semiconductor thin film has a thickness on the order of 60 nm. However, when the thickness of the a-Si:H semiconductor thin film is in a range below 70 nm and the energy density of the laser beam is in a region II between the curves 32 and 33, the a-Si:H semiconductor thin film solidifies in an amorphous state, though the surface quality is satisfactory. However, the a-Si:H semiconductor thin film of a phase in the region II, a thickness smaller than 70 nm and a smooth surface can be changed into a crystalline semiconductor thin film having a smooth surface by irradiating the a-Si:H semiconductor thin film again with the laser beam having an energy density in the region I. When the a-Si:H semiconductor thin film is irradiated with the laser beam having an energy density in a region above the curve 33 corresponding to the roughening energy density $E_{DR}$, a crystalline semiconductor thin film of a phase in a region III having a rough surface and inferior electrical characteristics is formed.

Figure 4:
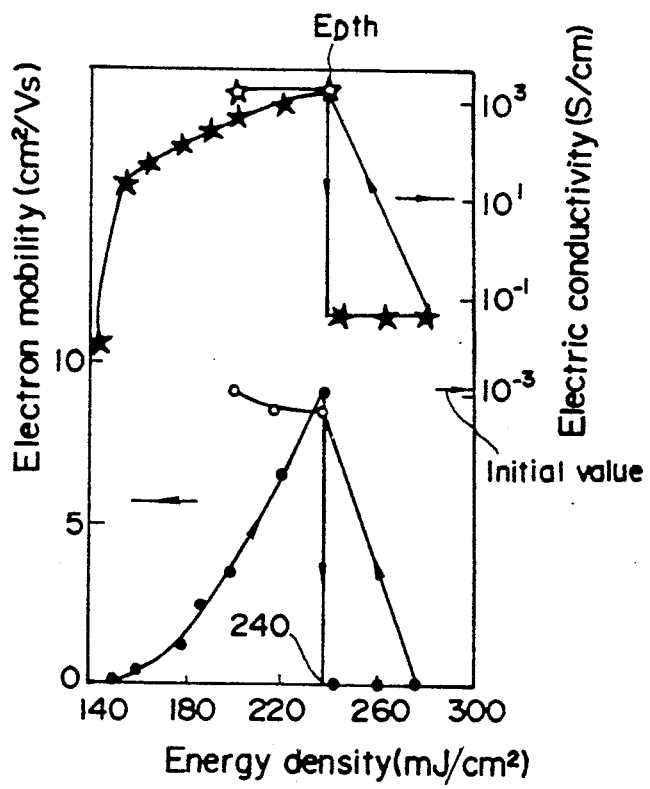
FIG. 4 is a graph showing the dependence of the electrical characteristics of a semiconductor thin film on the energy density of a laser beam used for irradiating the semiconductor thin film.

As is generally known, the electrical characteristics, such as electron mobility and electric conductivity, of the semiconductor thin film varies according to the quality of the same. FIG. 4 shows measured data representing the dependence of the electric conductivity and electron mobility of a silicon thin film of 20 nm in thickness doped with 20% phosphorus on the energy density of the laser beam, in which solid circles and blank circles are plots for the electron mobility, and solid stars and blank stars are plots for the electric conductivity. As is obvious from FIG. 4, the electron mobility and electric conductivity of the silicon thin film increase with the energy density and drop sharply at an energy density of 240 mJ/cm$^2$, which corresponds to the transition of the irradiating condition from the region I beyond the curve 32 to the region II shown in FIG. 3. The critical energy density that causes the electron mobility and the electric conductivity to drop sharply, i.e., an energy density on the curve 32, is the threshold energy density $E_{Dth}$ above which the semiconductor thin film becomes amorphous. However, as indicated by plots of blank circles and blank stars in FIG. 4, a semiconductor thin film having a high electron mobility and a high electric conductivity nearly equal to the peak values, respectively, can be formed by heating the amorphous semiconductor thin film again with a laser beam having an energy density not higher than and nearly equal to the threshold energy density $E_{Dth}$; that is, the volatile substances contained in the semiconductor thin film are evaporated at a moderate rate by irradiating the semiconductor thin film with the second secondary laser beam, the semiconductor thin film is converted into an amorphous semiconductor thin film by irradiating the semiconductor thin film with the first secondary laser beam, and then the amphorous semiconductor thin film is converted into a crystalline semiconductor thin film having excellent characteristics indicated by the blank circle and the blank star in FIG. 4 by irradiating the amorphous semiconductor thin film with the third secondary laser beam having an energy density in the region I.

A method of crystallizing a semiconductor thin film in a preferred embodiment according to the present invention will be described hereinafter.

Figure 1:
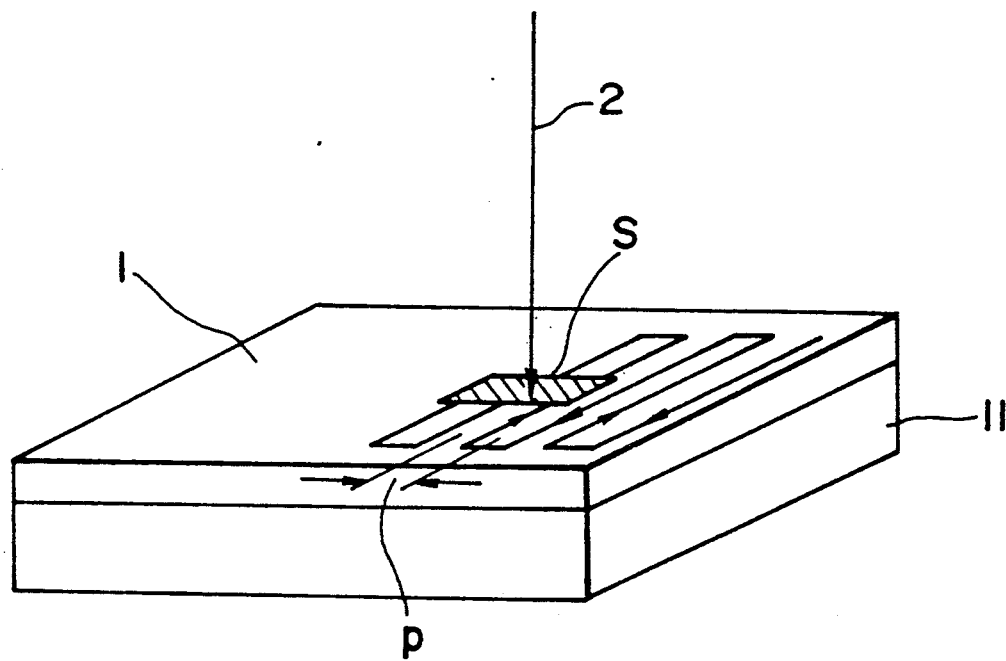
FIG. 1 is a pictorial view of assistance in explaining a method of crystallizing a semiconductor thin film in a preferred embodiment according to the present invention.
Figure 2A:
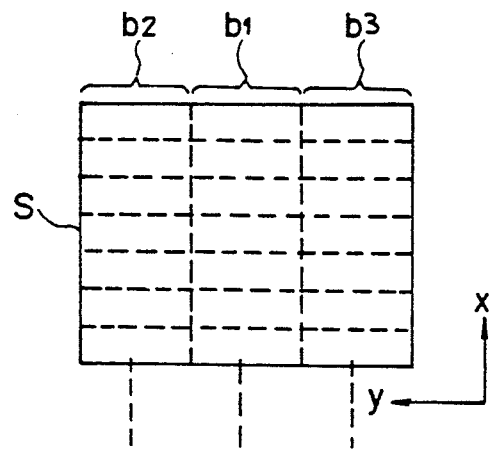
FIGS. 2A, 2B and 2C are diagrams showing the distribution of energy density in a spot formed by a laser beam employed in carrying out the method on a semiconductor thin film.
Figure 2B:
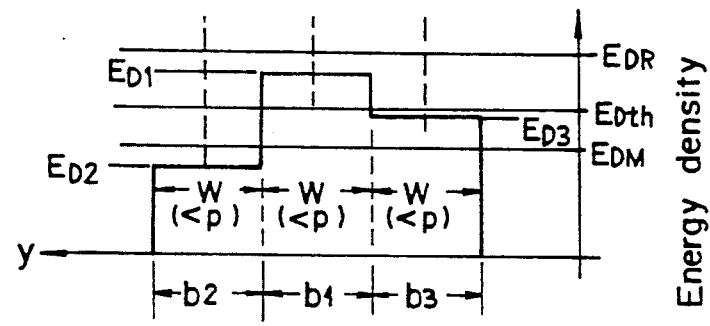
Figure 5:
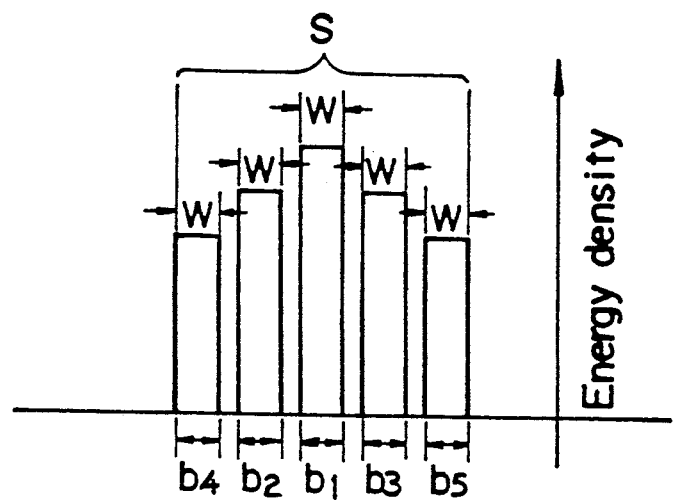
FIG. 5 is a diagram showing energy density distribution in another laser beam employed in carrying out the present invention.
Figure 6:
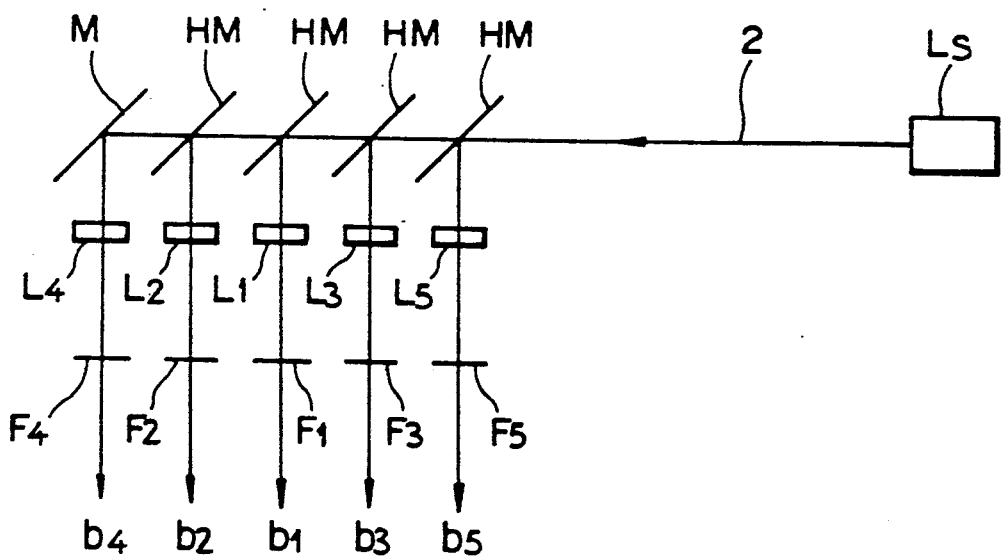
FIG. 6 is a diagrammatic view of an optical system for splitting a laser beam into secondary laser beams having different energy densities in a desired energy density distribution.

A semiconductor thin film 1, such as an a-Si:H thin film (amorphous silicon hydride thin film), an a-Ge:H thin film (amorphous germanium hydride thin film), a semiconductor thin film containing hydrogen and the like, or a semiconductor thin film scarcely containing hydrogen and the like, is formed on a substrate 11, such as a quartz substrate, in a thickness on the order of 70 nm or less by a chemical vapor deposition process (CVD process). The semiconductor thin film 1 is irradiated with a laser beam emitted by a pulse laser 2 for melt growth crystallization. The laser beam is moved in a first direction x for scanning and in a second direction y for feeding along a zigzag path. The laser beam is split with respect to the second direction y into three secondary laser beams $b_1$, $b_2$ and $b_3$ as shown in FIGS. 2A and 2B or into more than three secondary laser beams, for example, five secondary laser beams $b_1$ to $b_5$ as shown in FIG. 5. For example, as shown in FIG. 6, a laser beam 2 emitted by a pulse laser $L_s$ is split into five laser beams with four half mirrors HM and one mirror M, and then the laser beams are transmitted through condenser lens systems $L_1$ to $L_5$ and filters $F_1$ to $F_5$ to obtain five secondary laser beams $b_1$ to $b_5$ having a width W smaller than the pitch p of step feed in the second direction y and respectively having energy densities of a distribution as shown in FIG. 5. The energy density $E_{D1}$ of the first secondary laser beam $b_1$, i.e., the central secondary laser beam, meets an inequality:

$$E_{Dth} \leq E_{D1} < E_{Dr} \qquad (1)$$

and the respective energy densities of the rest of the secondary laser beams $b_2$ to $b_5$ are lower than the threshold energy density $E_{Dth}$. The energy densities of the secondary laser beams $b_2$ to $b_5$ nearer to the first secondary laser beam $b_1$ are higher than those of the secondary laser beams $b_2$ to $b_5$ further from the first secondary laser beam $b_1$. The energy density varies stepwise. The respective energy densities $E_{D2}$ and $E_{D3}$ of the second secondary laser beam $b_2$ and the third secondary laser beam $b_3$ meet inequalities:

$$E_{D2} > E_{DM} \qquad (2)$$

$$E_{DM} \leq E_{D3} < E_{Dth} \qquad (3)$$

Figure 2C:
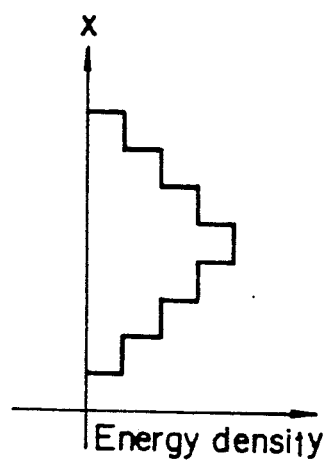

The fourth secondary laser beam $b_4$ having the energy density $E_{D4}$ lower than that of the second secondary laser beam $b_2$ and the second secondary laser beam $b_2$ having the energy density $E_{D2}$ lower than that of the first secondary laser beam $b_1$ on the front side of the first secondary laser beam $b_1$ with respect to the second direction y irradiate the semiconductor thin film 1 in that order to evaporate the volatile substances contained in the semiconductor thin film 1 at a moderate rate. When the semiconductor thin film 1 is irradiated with the first secondary laser beam $b_1$, a phase in the region II is formed in the semiconductor thin film 1. When the semiconductor thin film of the phase in the region II is irradiated again with the third secondary laser beam $b_3$ having an energy density lower than and nearly equal to the threshold energy density $E_{Dth}$, a phase in the region I is formed in the semiconductor thin film. In this example of the laser beam shown in FIG. 5, the energy density distribution is symmetrical with respect to the energy density of the first secondary laser beam $b_1$. The energy density distribution is dependent on the respective transmissivities of the filters $F_1$ to $F_5$. the energy density distribution with respect to the first direction x in the spot of each of the secondary laser beams $b_1$ to $b_5$ also can selectively be determined so that the energy density increases stepwise or in a smooth curve from the rear end of the spot with respect to the first direction x toward the middle of the spot and decreases stepwise or in a smooth curve from the middle of the spot toward the front end of the spot with respect to the first direction x as shown in FIG. 2C by selectively determining the distribution of transmissivity in each of the filters $F_1$ to $F_5$. The use of the secondary laser beams having such an energy density distribution enables the further moderate evaporation of the volatile substances contained in the semiconductor thin film 1 and enables forming a crystalline semiconductor thin film of a further improved quality.

As mentioned above with reference to FIG. 4, according to the present invention, a semiconductor thin film is converted once into an amorphous semiconductor thin film by irradiating the semiconductor thin film with the first secondary laser beam $b_1$, and then the amorphous semiconductor thin film is converted into a crystalline semiconductor thin film having excellent electrical characteristics by irradiating the amorphous semiconductor thin film with the third secondary laser beam $b_3$ having an energy density lower than and nearly equal to the threshold energy density $E_{Dth}$.

Figure 7A:
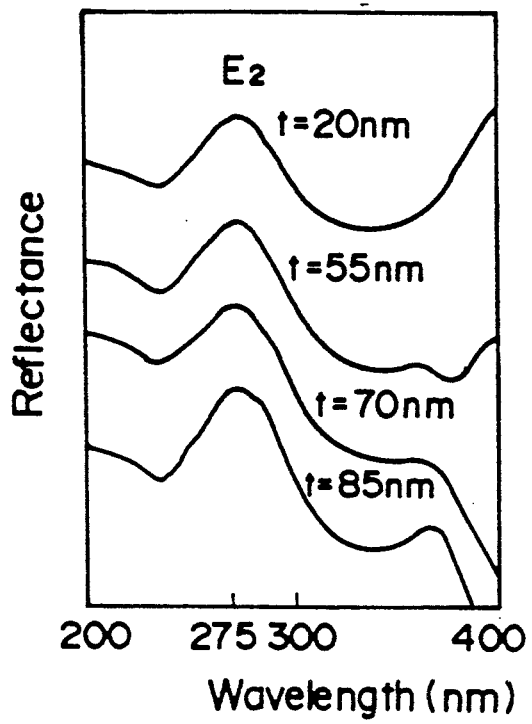
FIGS. 7A and 7B are diagrams showing reflection spectra for the thickness of a semiconductor thin film.
Figure 7B:
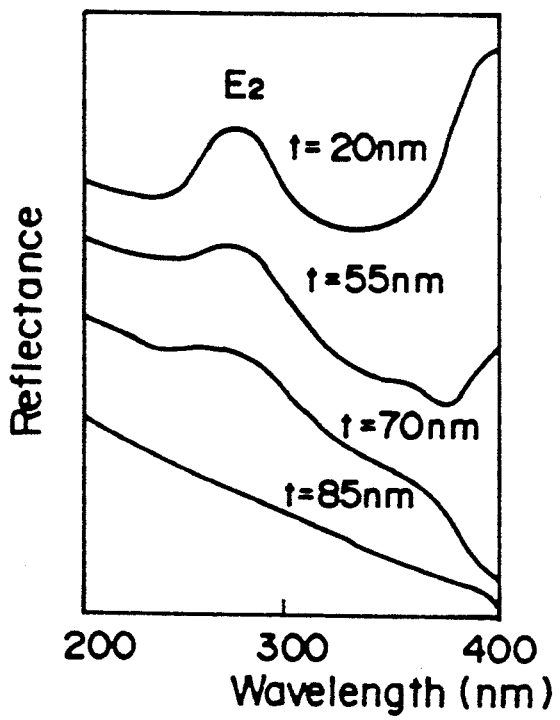

FIGS. 7A and 7B are reflection spectra of semiconductor thin films formed by processing a-Si:H semiconductor thin films differing in thickness t from each other by the method of the present invention measured on the front side, i.e., the side of the semiconductor thin film 11, and on the backside, i.e., the side of the quartz substrate 11, respectively. As shown in FIGS. 7A and 7B, the $E_2$ peak of silicon crystal corresponds to a wavelength of 275 nm, which indicates that the semiconductor thin films are crystallized. In the spectra shown in FIG. 7B, the $E_2$ peak does not appear when t>70 nm, which indicates that an amorphous layer is formed between the semiconductor thin film 1 and the substrate 11. That is, the semiconductor thin film can entirely be crystallized when t≦70 nm.

The pattern of energy distribution in each of the secondary laser beams need not necessarily be symmetric; the pattern may be asymmetric provided that the foregoing condition for energy density is satisfied.

The present invention is not limited in its application to the crystallization of Si and Ge semiconductor thin films containing hydrogen and is applicable to the crystallization of Si and Ge semiconductor thin films scarcely containing hydrogen, and other semiconductor thin films.

Although the invention has been described in its preferred form with a certain degree of particularity, obviously many changes and variations are possible therein. It is therefore to be understood that the present invention may be practiced otherwise than as specifically described herein without departing from the scope and spirit thereof.

What is claimed is:

1. A method of melt growth system of crystallizing a semiconductor thin film by irradiating the semiconductor thin film with a laser beam emitted by a pulse laser, characterized in that:

the laser beam emitted by the pulse laser is moved in irradiating the semiconductor thin film in a first direction for scanning and in a second direction for step feed;

the laser beam emitted by the pulse laser is split into a plurality of secondary laser beams of a width smaller than the pitch of step feed, respectively having energy densities forming a stepped energy density distribution decreasing from the middle toward the opposite ends thereof with respect to the second direction;

the energy density $E_{D1}$ of the first secondary laser beam corresponding to the middle of the energy density distribution is higher than a threshold energy density $E_{Dth}$, that is, the minimum energy density that will melt the semiconductor thin film to make the semiconductor thin film amorphous, and lower than a roughening energy density $E_{DR}$, that is, the minimum energy density that will roughen the surface of the semiconductor thin film;

the energy density of each of the secondary laser beams on the front side of the first secondary laser beam with respect to the second direction is lower than a melting energy density $E_{DM}$, that is, the minimum energy density that will melt the semiconductor thin film; and the energy density of each of the secondary laser beams on the back side of the first secondary laser beam with respect to the second direction is higher than the melting energy density $E_{DM}$ and lower than and nearly equal to the threshold energy density $E_{Dth}$.

2. A method of melt growth system of crystallizing a semiconductor thin film according to claim 1, wherein the laser beam emitted by the pulse laser is split into first, second and third secondary laser beams respectively having energy densities forming a stepped energy density distribution, the energy density $E_{D1}$ of the first secondary laser beam forming the middle energy density of the energy density distribution is higher than the threshold energy density $E_{Dth}$ and is lower than he roughening energy density $E_{DR}$, the energy density $E_{D2}$ of the second secondary laser beam on the front side of the first secondary laser beam with respect to the second direction is lower than the melting energy density $E_{DM}$, and the energy density $E_{D3}$ of the third secondary laser beam on the back side of the first secondary laser beam with respect to the second direction is higher than the melting energy density $E_{DM}$ and lower than and nearly equal to the threshold energy density $E_{Dth}$.

3. A method of melt growth system of crystallizing a semiconductor thin film according to claim 1, wherein the energy density of each of the plurality of secondary laser beams forms a stepped energy density distribution decreasing stepwise from the middle toward the opposite ends thereof with respect to the first direction.

* * * * *